United States Patent Office 3,440,047

Patented Apr. 22, 1969

3,440,047

PHOTOPOLYMER OFFSET PRINTING PLATES OF THE ETCH TYPE

Steven Levinos, Vestal, and John A. Bergfjord, Binghamton, N.Y., assignors to General Aniline & Film Corporation, New York, N.Y., a corporation of Delaware No Drawing. Filed Aug. 10, 1964, Ser. No. 388,710
Int. Cl. G03c *1/68;* G03f *1/02*
U.S. Cl. 96—36.3 5 Claims

ABSTRACT OF THE DISCLOSURE

A process for preparing an offset printing image, and a light-sensitive material for utilization therein, said light-sensitive material comprising a copper or chromium coated aluminum plate having thereon an acrylic resin coating and superposed thereon, a dried coating of an emulsion containing a photopolymerizable compound, said process comprising the imagewise exposure of the photopolymerizable surface to light, development and removal of the unpolymerized resin in the unexposed area, followed by etching of the metallic coating in that area, and finally, removal of the photopolymer and acrylic resin.

The present invention relates to presensitized negative or positive working metal offset printing plates of the etch type having a matrix of a stabilized vinyl polymer latex containing a water-soluble ethylenically unsaturated monomer and a photoinitiator which upon irradiation induces polymerization of the monomer.

Photopolymerization systems have been proposed in which a gelatin matrix contains a monomer and as a photoinitiator a ferric ($Fe^{+3}$) or ceric ($Ce^{+4}$) salt which induces image wise polymerization of the monomer in the presence of a per compound or reducing agent.

It is understood that in these systems the chain initiating process leading to polymerization of the monomer is due to a redox initiated, free radical generation with subsequent addition polymerization.

Moreover, in these systems the monomer is soluble in gelatin solutions or solutions of hydrophilic gelatin substitutes. Consequently, the polymer resist obtained by exposure and washout of the unpolymerized areas is still water sensitive although its water solubility is greatly reduced.

In order to obtain increased oil receptively of such a resist, it has been suggested that there be dispersed in the gelatin maxtrix a water-insoluble vinyl or acrylic resin. To this end, resort is had to such polymers as phenol modified cumarone-indene resins, polyvinyl acetate, polymethyl acrylate, polyethyl acrylate; cellulose ethers such as ethyl cellulose; cellulose esters such as cellulose acetate, cellulose propionate, cellulose acetate-butyrate, and the like.

To obtain a photopolymerizable coating, these lipophilic resins are dispersed into an aqueous solution containing gelatin, a water-soluble ethylenically unsaturated monomer containing a $CH_2{=}C{<}$ group and a photoinitiator such as those referred to above.

It is believed that, under the influence of radiation to which the coating is subjected, a water-insoluble three-dimensional polymer network is formed with the lipophilic resin trapped between the chains of the network.

Such systems, unfortunately, have several disadvantages, one being their relative instability. Precipitation of the dispersed resin from the aqueous gelatin phase often occurs during the coating of the emulsion on a metal surface. Furthermore, the adhesion of the coating to the surface of the metal plate, either pretreated or untreated, is most unsatisfactory. Thus, in many cases the exposed areas of the coating adhere insufficiently to the metal surface and are removed during development. In other cases, it is difficult to remove the unexposed areas during the washout operation.

It has now been discovered that these disadvantages can be overcome and presensitized coatings of good stability and adhesion to metal plates may be obtained by using as the matrix, a stabilized emulsion of lipophilic vinyl or acrylic polymers or copolymers and by anchoring such a matrix to the surface of the metal base by means of a thermoplastic, film-forming acrylic resin.

The preparation of negative or positive working metal offset printing plates utilizing these features constitutes the purpose and objective of the present invention.

The base plate is preferably aluminum over which is electroplated a thin layer of copper (Lithengrave plate developed by the Lithographic Technical Foundation), or it may carry an additional surface of metal by electrodeposition of chromium on the copper layer. Such plates, after pretreatment, are coated with a resin layer designed to tenaciously anchor the resin matrix containing the monomer and photoinitiator to the surface of the metal and to relax adhesion of the unexposed areas during processing, so that they may be removed during the washing step. An aluminum plate coated with copper will eventually lead to a negative plate. A plate which carries an additional chromium layer will eventually produce a positive plate.

Preferably, the anchoring layer which is employed is a thermoplastic, film-forming acrylic acid resin, which is soluble in ammonia and sold by the B. F. Goodrich Chemical Company as Carboset 525. Usually, this resin is applied in the form of an 0.5 to 1% solution in isopropyl alcohol, although other solvents such as methanol, ethanol, acetone, diacetone alcohol, methyl cellosolve, dioxane, cyclohexanol, ethyl acetate, and the like may be employed. The addition of a small quantity of oleic acid and a surface-active agent such as Alkaterge A (Commercial Solvents Corporation) is advantageous in promoting uniform wetting when the resin is applied to the metal surface. If desired, a small quantity of a suitable shade dye may be added to this solution to enhance the contrast of the coating on the metal surface. Alkaterage A is substituted oxazoline of the following general formula:

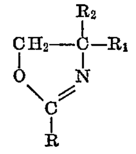

wherein R is a long chain alkyl group such as pentadecyl or heptadecyl, while $R_1$ and $R_2$ are lower alkyl groups, such as methyl, ethyl, propyl, isopropyl, butyl, isobutyl, amyl, and the like. In its preferred form, R is heptadecyl and $R_1$ and $R_2$ are methyl or ethyl.

The matrix applied to the subcoated metal base is a stabilized emulsion of a lipophilic vinyl polymer, such as polymethyl acrylate, polyethyl acrylate, polyvinyl acetate; copolymers of vinyl acetate and ethyl acrylate; terpolymers of ethyl acrylate, butyl acrylate and vinyl acetate, of ethyl acrylate, styrene and methacrylic acid, of vinyl acetate, octyl fumarate and maleic acid, of vinyl acetate, butyl maleate and acrylic acid, and the like.

Techniques for the stabilization of these polymer and copolymer emulsions are well known; and, in this connection reference is made to the formulations published by the Celanese Corporation in "Vinyl Acetate Monomers in Emulsion Technology," pages 19 to 25, and "Acrylates," pages 27 to 32. Further, such stabilized emulsions are sold on the open market by the Celanese Corporation, National Starch and Chemical Corporation, and other manufacturers.

Particularly valuable emulsions for our purpose are the vinyl acetate copolymers and terpolymers sold by National Starch and Chemical Corporation as Resyns 78–3113, 25–2203, 16–4601, 25–2200, 25–1411 and 25–1234. The average solid content of these emulsions is about 45 to 50%, average grain size about .1 micron and average viscosity about 650 cps.

Of these polymers, Resyns 78–3113, 25–2203, 16–4601 and 25–1411 are the copolymers of vinyl acetate and unsaturated acids, which contain at least one free carboxy group, such as crotonic acid, maleic acid, acrylic acid, methacrylic acid, itaconic acid and fumaric acid. Resyns 25–2200 and 25–1234 are terpolymers prepared by reacting the above-described copolymers with an internal plasticizer. The latter compounds can be described as "chain spacers" which give to the terpolymers more flexibility, softness, higher elongation and lower second order transition temperatures (brittle points). The monomers which serve as these internal plasticizers can be described as acrylic and methacrylic esters with relatively long side chains of from 2 to 8 carbon atoms. Suitable illustrations are ethyl, butyl or 2-ethyl hexyl acrylate, ethyl, butyl or 2-ethyl hexyl maleic and fumaric esters as illustrated by dibutyl maleate or di(2-ethyl hexyl)fumarate.

The resins are emulsified in a starch or dextrose solution. If desired, other water-soluble colloids preventing agglomeration of the polymer particles may be used, such as polyvinyl alcohol, methyl cellulose, sodium polyacrylate and the like. Preferably, the pH of the emulsion should not exceed 6.0.

The water-soluble monomer containing a $CH_2{=}C{<}$ group and the photoinitiator are dispersed in the resin emulsion while resorting to the use of surfactants such as lauryl sulfate, oleyl-N-methyl taurine sodium salt, saponin, or the like, if desired. Examples of suitable monomers are acrylamide, methacrylamide, N-ethanolacrylamide, acrylic acid, methacrylic acid, calcium acrylate, vinyl acetate, N,N′-methylene bisacrylamide, divinylbenzene, and the like. Preferably, use is made of those monomers having a cross-linking function, as sharper resists are produced therewith.

Any radiation-sensitive photopolymerization catalyst or photo initiator may be employed. Suitable for the contemplated purpose are silver compounds, such as silver nitrate, silver chloride, etc.; silver halide emulsions, such as silver bromide developing-out emulsions; amphoteric metal oxides, such as zinc oxide or titanium dioxide; ceric salts with reducing agents, as in application Ser. No. 229,502, filed Oct. 9, 1962; and, particularly, the ferric salt system of U.S. Patent 3,101,270, dated Aug. 20, 1963. Best results ensue when the matrix contains a radiation-sensitive ferric salt and the resist is developed by treatment in a dilute solution of a per compound such as hydrogen peroxide. However, it is also feasible to add the per compound, if solid or liquid, to the matrix and to develop with water.

The speed of the photopolymerization system may be increased by the addition of a sugar such as dextrose. This is particularly true where the catalyst employed is a ferric salt.

The plate is made up by dissolving the resin of the subcoat in isopropyl alcohol or other solvent, adding the oleic acid and surfactant, coating the mixture on the base plate, and drying.

The resin emulsion forming the matrix is dispersed in water with the catalyst, monomer, dextrose and surfactant, coated over the subcoat and dried.

Processing of the plate may then take place as described in the examples.

The invention is illustrated in the following examples, but it is to be understood it is not limited thereto.

EXAMPLE I

A copper surfaced aluminum plate was rinsed with warm water to remove the protective gum layer. It was then flushed with nitric acid (2 ounces per gallon of water) for about 30 seconds. It was rinsed thoroughly again with water, followed by an acetone rinse. After drying, the plate was coated with the following composition:

| | Cc. |
|---|---|
| Carboset 525, 0.75% in isopropyl alcohol | 98.0 |
| Alkaterge A, 1% in isopropyl alcohol | 1.0 |
| Oleic acid, 2% in isopropyl alcohol | 1.0 |

This solution was filtered and then applied to the copper surface by flow coating, using 5 cc. per square foot of area to be coated. The coating was allowed to dry for a period of 15 to 20 minutes and then overcoated in subdued yellow light with a mixture of the following composition:

| | | |
|---|---|---|
| Resyn 25–2200 (vinyl:acrylic terpolymer) | g. | 20 |
| Resyn 25–1411 (vinyl acetate copolymer) | g. | 5 |
| N,N′-methylenebisacrylamide | g. | 2 |
| Dextrose | g. | 2 |
| Water | cc. | 60 |
| Saponin, 8% | cc. | 2 |
| Ferric ammonium citrate, 36%, brown | cc. | 5 |

This mixture was applied to the overcoated copper surface by flow coating, using 7.5 cc. per square foot of area to be coated. After drying in subdued yellow light, preferably over night, the plate was exposed through a photographic negative to a 15 watt BL light source at a distance of 2½ to 3 inches for an exposure time of 5 minutes.

After exposure, the plate was dipped in a 1% aqueous hydrogen peroxide solution. The unexposed parts were thereafter washed from the plate with a soft cellulose sponge dipped in water at 40 to 45° C. Subsequently, the plate was rinsed with water and dried for 5 minutes with a warm air blast. The undercoating in the nonexposed areas was not removed by swabbing the plate for 30 seconds with a wad of cotton previously immersed in a solution consisting of two parts of water, one part of isopropyl alcohol and one part of ethylene glycol. The plate was then flushed with water and dried again for 5 minutes with a warm air blast.

A ferric chloride etch solution, of the type described on page 214 of "Offset Platemaking" (Lithographic Technical Foundation, 1955), was now spread evenly over the entire plate. This solution had the following composition:

| | | |
|---|---|---|
| Iron perchloride, crystals | g. | 4800 |
| Water | cc. | 1000 |

The plate was swabbed with a wad of cotton until the copper showed signs of dissolving. One or more applications of the etch solution were made until all traces of copper were removed from the nonprinting areas. The plate was then flushed with water and the resin coating was removed from the image areas by rubbing with a cotton wad wetted with isopropyl alcohol. The plate was then rinsed with water. It was now ready for the preinking, inking and gumming-up steps in the usual manner.

EXAMPLE II

This was similar to Example I except that 25 grams of Resyn 25–2200 was used in the overcoating composition, with omission of Resyn 25–1411. Results after processing were the same as in Example I.

EXAMPLE III

This was similar to Example I except that the following mixture of resins was used with the monomer and other ingredients in place of the resins of Example I:

| | G. |
|---|---|
| Resyn 25–2200 | 20.0 |
| Resyn 25–1411 | 2.5 |
| Resyn 25–1234 (vinyl acetate terpolymer) | 2.5 |

Results after processing were the same as in Example I.

EXAMPLE IV

An ungummed chromium surfaced plate was prepared by rinsing with warm water, followed by an acetone rinse. It was dried and then coated as in Example I, using the same undercoat and overcoat compositions. After exposure through a photographic positive, followed by peroxide treatment, washout, drying and removal of the undercoating, the plate was dried for 5 minutes with a warm air blast. A chromium etch solution, of the type described on page 182 of "Offset Platemaking" (Lithographic Technical Foundation, 1955), was then used to etch away the chromium in the unexposed image areas. This solution had the following composition:

| | |
|---|---|
| Aluminum chloride solution, 32° Bé. ----------cc-- | 750 |
| Zinc chloride ----------------------------------g-- | 630 |
| Phosphoric acid, 85% -----------------------cc-- | 40 |

After flushing with water, the resin coating was removed from the nonimage areas by rubbing with a cotton wad immersed in isopropyl alcohol as in Example I. The plate was then ready for the ensuing steps of preinking, inking and gumming-up in the usual manner.

EXAMPLE V

This was similar to Example IV except that the overcoating composition of Example II was employed.

EXAMPLE VI

This was similar to Example IV except that the overcoating composition of Example III was employed.

It will be understood that various modifications, in addition to those suggested above, may be made by those skilled in the art without departing from the principle of this invention.

What is claimed is:

1. A light-sensitive material comprising an aluminum plate, having a surface coating selected from the class consisting of copper and chromium, carrying a thermoplastic, film-forming acrylic resin as an anchoring layer, which in turn is overcoated with a light-sensitive layer comprising an emulsion of a lipophilic vinyl polymer dispersed in a water-soluble colloid, a water-soluble monomer containing the terminal grouping $CH_2=C<$, and a light-sensitive photopolymerization catalyst.

2. A light-sensitive material according to claim 1 wherein said monomer is N,N'-methylenebisacrylamide.

3. A light-sensitive material according to claim 1 wherein said light-sensitive layer contains dextrose.

4. A light-sensitive material according to claim 1 wherein said photopolymerization catalyst is ferric ammonium citrate.

5. A process of preparing an offset printing image which comprises coating an aluminum plate having a metallic surface layer selected from the class consisting of copper and chromium, with an anchoring layer comprising a thermoplastic, film-forming acrylic resin, and coating said anchoring layer with a light-sensitive layer comprising a stabilized emulsion of a lipophilic vinyl polymer selected from the group consisting of polymethyl acrylate, polyethyl acrylate, polyvinyl acetate; copolymers of vinyl acetate and ethyl acrylate; terpolymers of ethyl acrylate, butyl acrylate and vinyl acetate, of ethyl acrylate, styrene and methacrylic acid, of vinyl acetate, octyl fumarate and maleic acid, of vinyl acetate, butyl maleate and acrylic acid, a water-soluble colloid selected from the group consisting of starch, dextrose, polyvinyl alcohol, methyl cellulose and an alkali metal polyacrylate, a water-soluble monomer containing the terminal grouping $CH_2=C<$, and a light-sensitive photopolymerization catalyst, image wise exposing said material so as to form a latent image, developing said image so as to cause polymerization in the exposed areas, removing the coating in the unpolymerized unexposed areas, treating the plate with an etch solution so as to remove the top metal coating from the non-image areas and removing the surface resin coating and the anchor layer from the printing plate with an aliphatic alcohol so as to form the desired image.

References Cited

UNITED STATES PATENTS

| | | | |
|---|---|---|---|
| 2,760,863 | 8/1956 | Plambeck | 96—35.1 |
| 2,875,047 | 2/1959 | Oster | 96—35.1 |
| 3,061,431 | 10/1962 | Levinos | 96—35.1 |
| 3,201,237 | 8/1965 | Cerwonka | 96—36 |
| 3,210,187 | 10/1965 | Thommes | 96—36 |

NORMAN G. TORCHIN, *Primary Examiner.*

R. E. MARTIN, *Assistant Examiner.*

U.S. Cl. X.R.

96—75, 86